United States Patent [19]
Ong et al.

[11] Patent Number: 4,573,116
[45] Date of Patent: Feb. 25, 1986

[54] MULTIWORD DATA REGISTER ARRAY HAVING SIMULTANEOUS READ-WRITE CAPABILITY

[75] Inventors: Richard H. Ong, Phoenix; Peter C. Economopoulos, Scottsdale; Russell W. Guenthner, Glendale, all of Ariz.

[73] Assignee: Honeywell Information Systems Inc., Phoenix, Ariz.

[21] Appl. No.: 563,350

[22] Filed: Dec. 20, 1983

[51] Int. Cl.[4] .............................................. G06F 1/00
[52] U.S. Cl. ................................................... 364/200
[58] Field of Search ... 364/200 MS File, 900 MS File

[56] References Cited
U.S. PATENT DOCUMENTS
4,245,304  1/1981  Porter et al. ..................... 364/200

*Primary Examiner*—Raulfe B. Zache
*Attorney, Agent, or Firm*—A. A. Sapelli; J. S. Solakian

[57] ABSTRACT

An improved multiword data register array which features RAM technology to provide a greater memory capacity in a smaller space than a conventional register arrays. Whereas RAM technology does not ordinarily include the capability of simultaneously reading and writing, in accordance with the present invention, data may be written into the register on a first half cycle of a clock signal and read out of memory on the second half cycle of the same clock signal. If the writing and the reading of the data relate to the same address in the register array, the data may be read directly from the input circuit.

4 Claims, 9 Drawing Figures

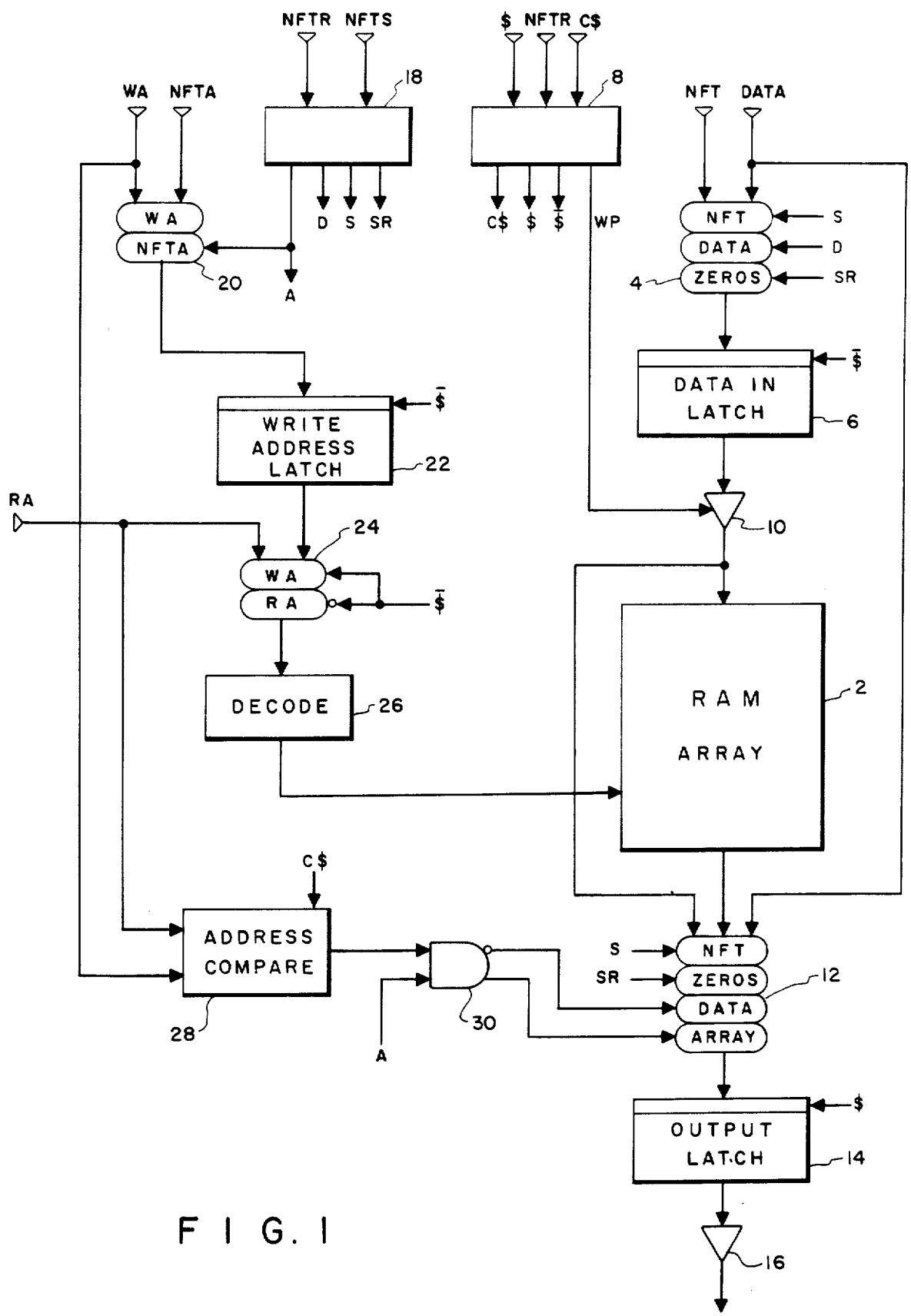
F I G. 1

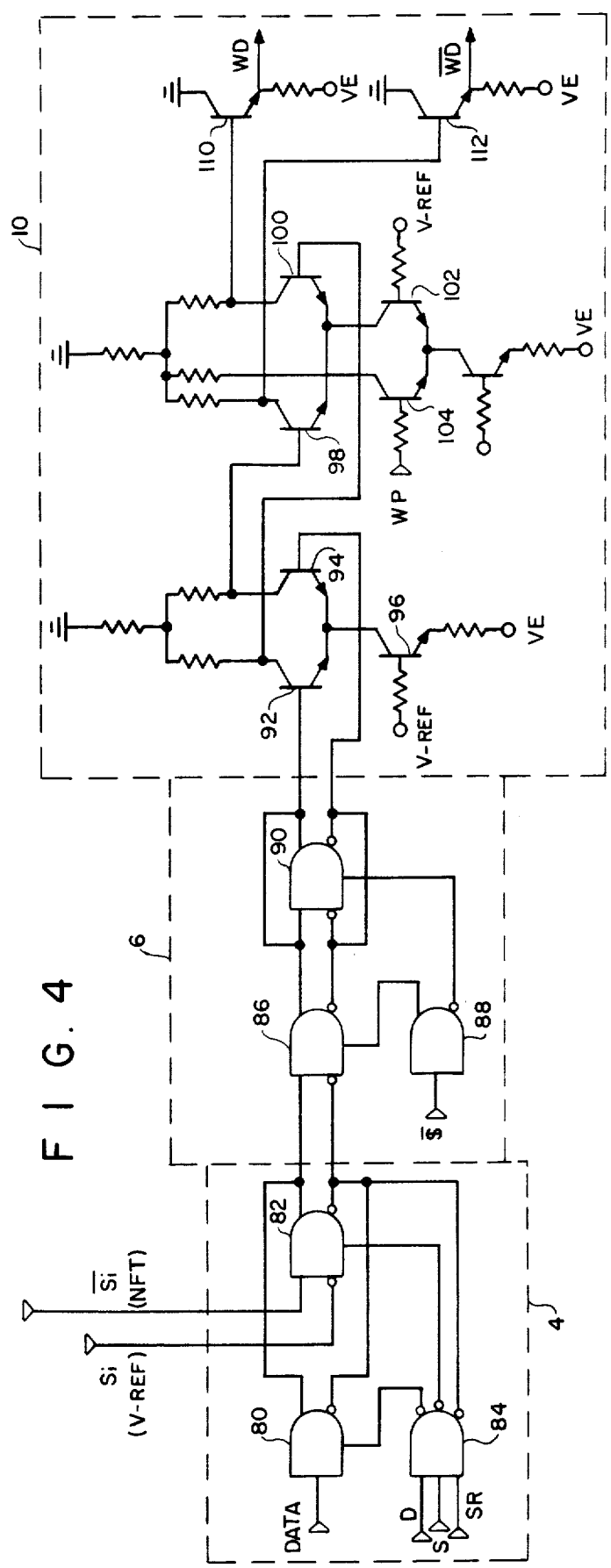
F I G. 4
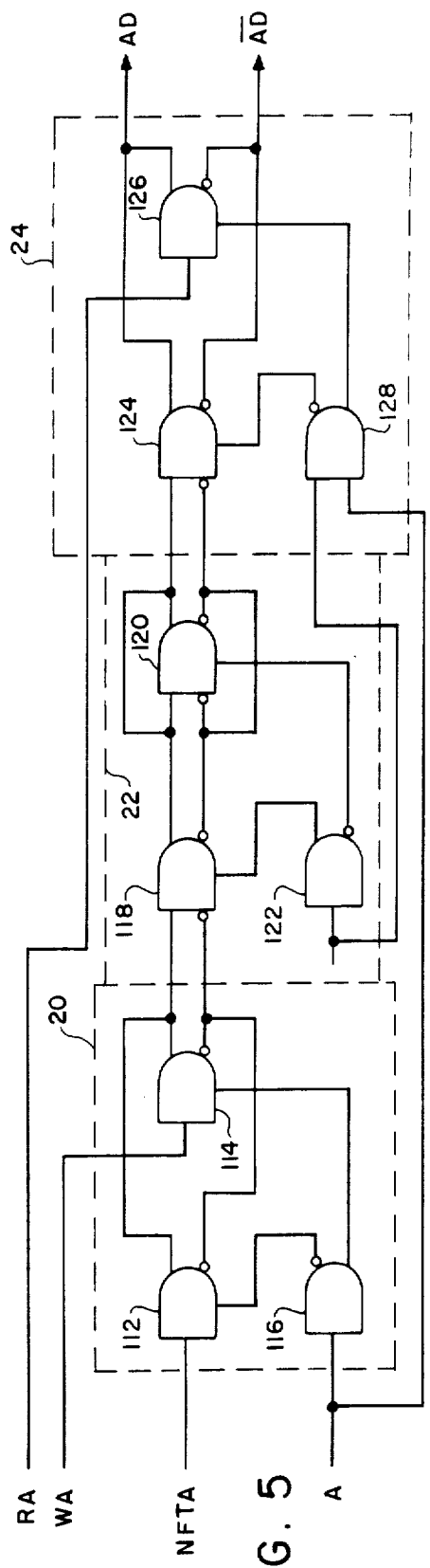
F I G. 5

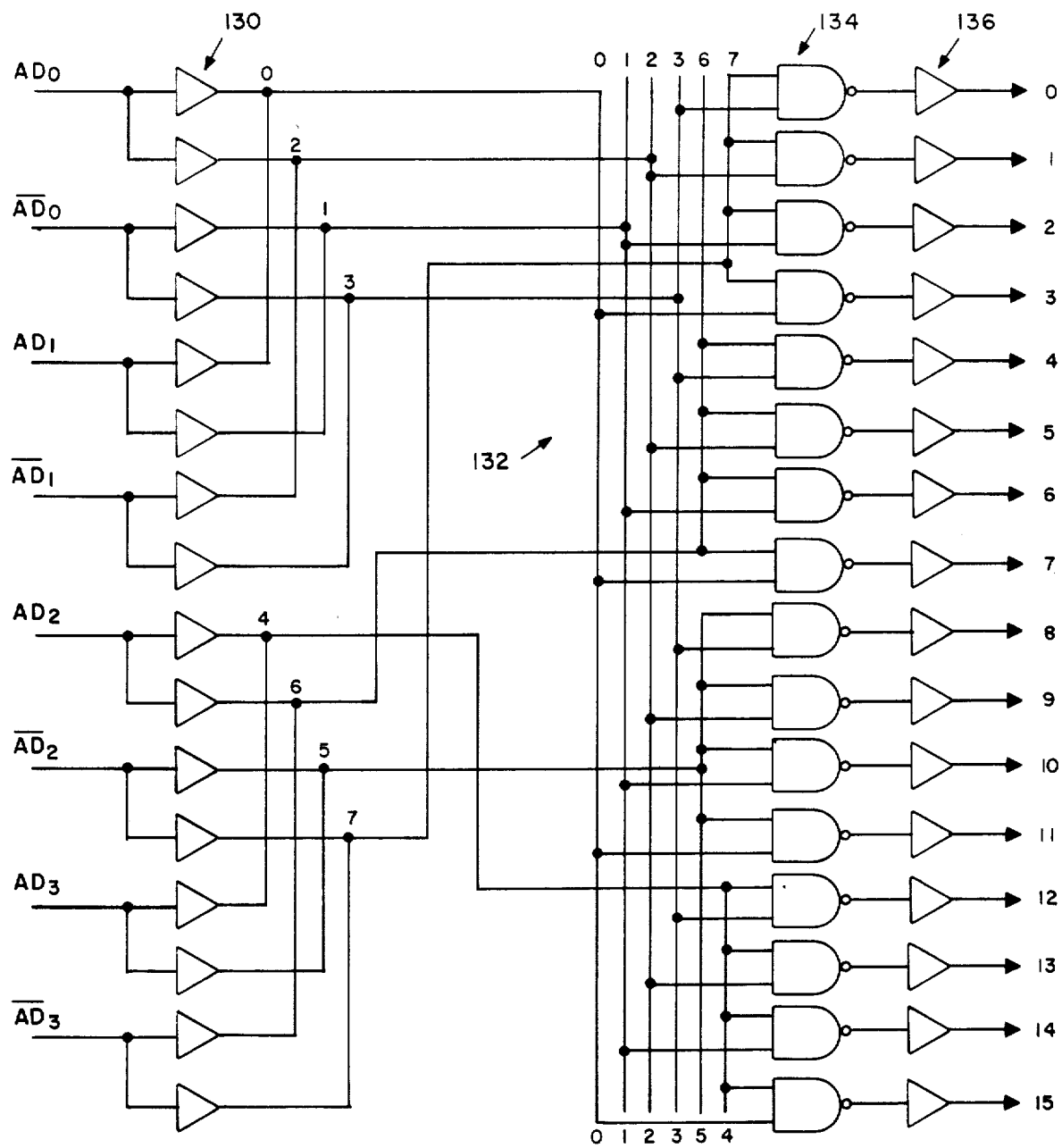
F I G. 6

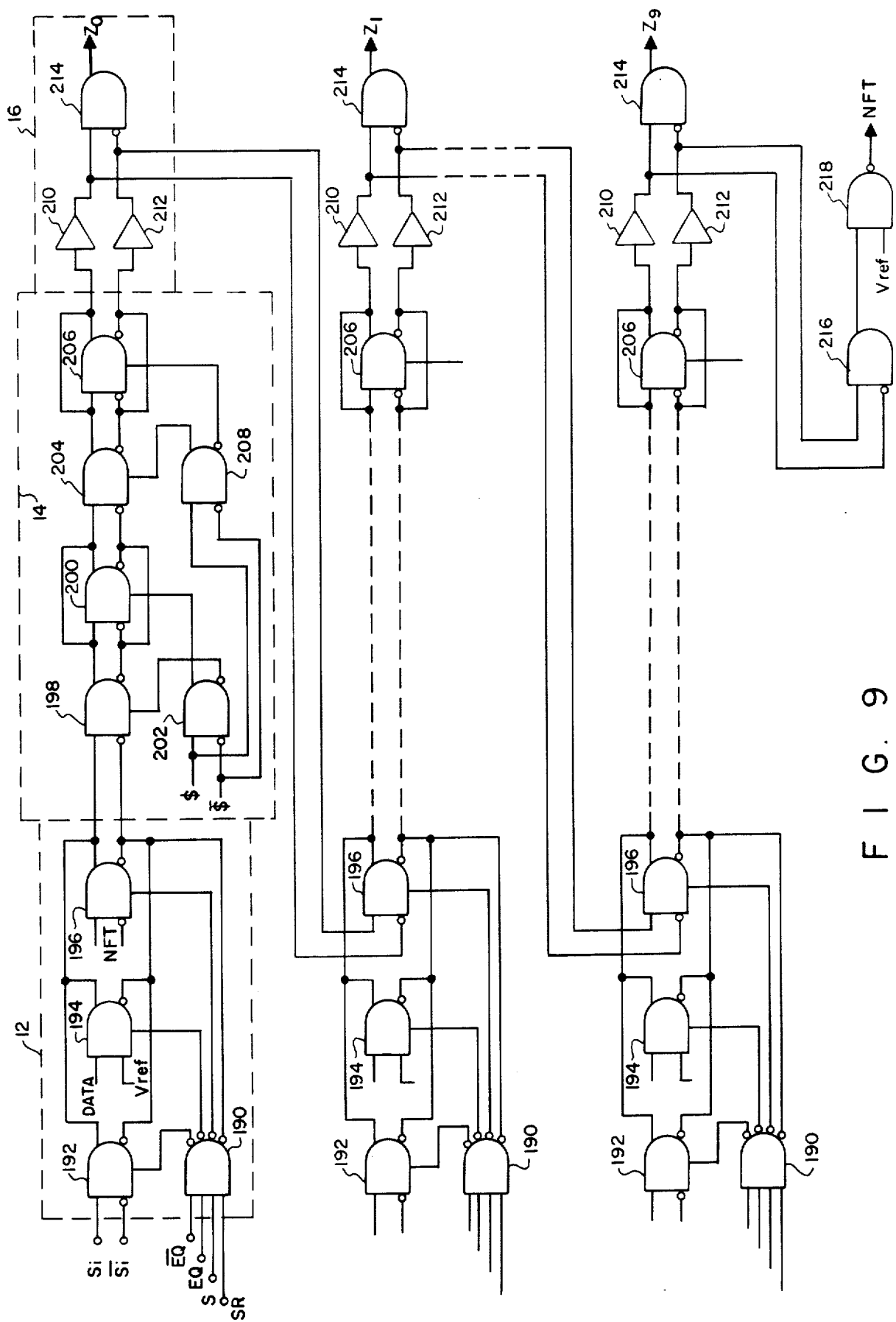
F I G. 9

MULTIWORD DATA REGISTER ARRAY HAVING SIMULTANEOUS READ-WRITE CAPABILITY

CROSS REFERENCES

Reference is made to copending applications Ser. No. 538,310 filed Oct. 3, 1983 in the name of R. Ong and P. Economopoulos; Ser. No. 538,394 filed Oct. 3, 1983 in the name of R. Ong and P. Economopoulos; and Ser. No. 538,387 filed Oct. 3, 1983 in the name of R. Ong, P. Econopoulos and R. Guenthner.

BACKGROUND OF THE INVENTION

The present invention relates to digital electronic computer systems. More particularly, it relates to register means for use in such a computer system.

In computer systems, there are numerous registers where small amounts of data are temporarily stored. Traditionally a register is made up of a plurality of memory cells defining a word or byte length. These registers may be arranged with a single word or byte of memory on an individual chip. Alternatively, they may be arranged as a stack with a plurality of individual addressable words or bytes of memory on a single chip, each word or byte occupying a single row. The individual words or bytes are addressed by addressing the designated row. In such a stacked register, a conventional requirement is that the register may be addressed to both read and write during the same clock cycle. To that end there are provided separate read and write address decode networks. Because of the necessary bulk of such arrangements, the memory capacity of such units was relatively small. In one such arrangement, the register had a capacity of 16 words, or bytes, of five bits each.

SUMMARY OF THE INVENTION

It is an object of the present invention to provide an improved stacked register arrangement which obviates the shortcomings of previous registers.

It is another object of the present invention to provide an improved register arrangement as set forth which enables a larger memory capacity in a smaller space.

In accomplishing these and other objects, there has been provided, in accordance with the present invention, an improved multiword data register array which features RAM technology to provide a greater memory capacity in a smaller space than a conventional register array. Whereas RAM technology does not ordinarily include the capability of simultaneously reading and writing, in accordance with the present invention, data may be written into the register on a first half cycle of a clock signal and read out of memory on the second half cycle of the same clock signal. If the writing and the reading of the data relate to the same address in the register array, the data may be read directly from the input circuit.

BRIEF DESCRIPTION OF THE DRAWING

A better understanding of the present invention may be had from the following detailed description when read in the light of the accompanying drawings in which:

FIG. 1 is a schematic block diagram of a register circuit constructed in accordance with the present invention;

FIG. 4 is a logic and schematic diagram of a write amplifier suitable for use in accordance with the circuit shown in FIG. 1;

FIG. 5 is a logic diagram of an address select circuit suitable for use in accordance with the present invention;

FIG. 6 is a logic diagram for an address decode logic suitable for use in the circuit shown in FIG. 1;

FIG. 9 is a logic diagram for an output circuit in accordance with the present invention.

DETAILED DESCRIPTION

Figure 2:
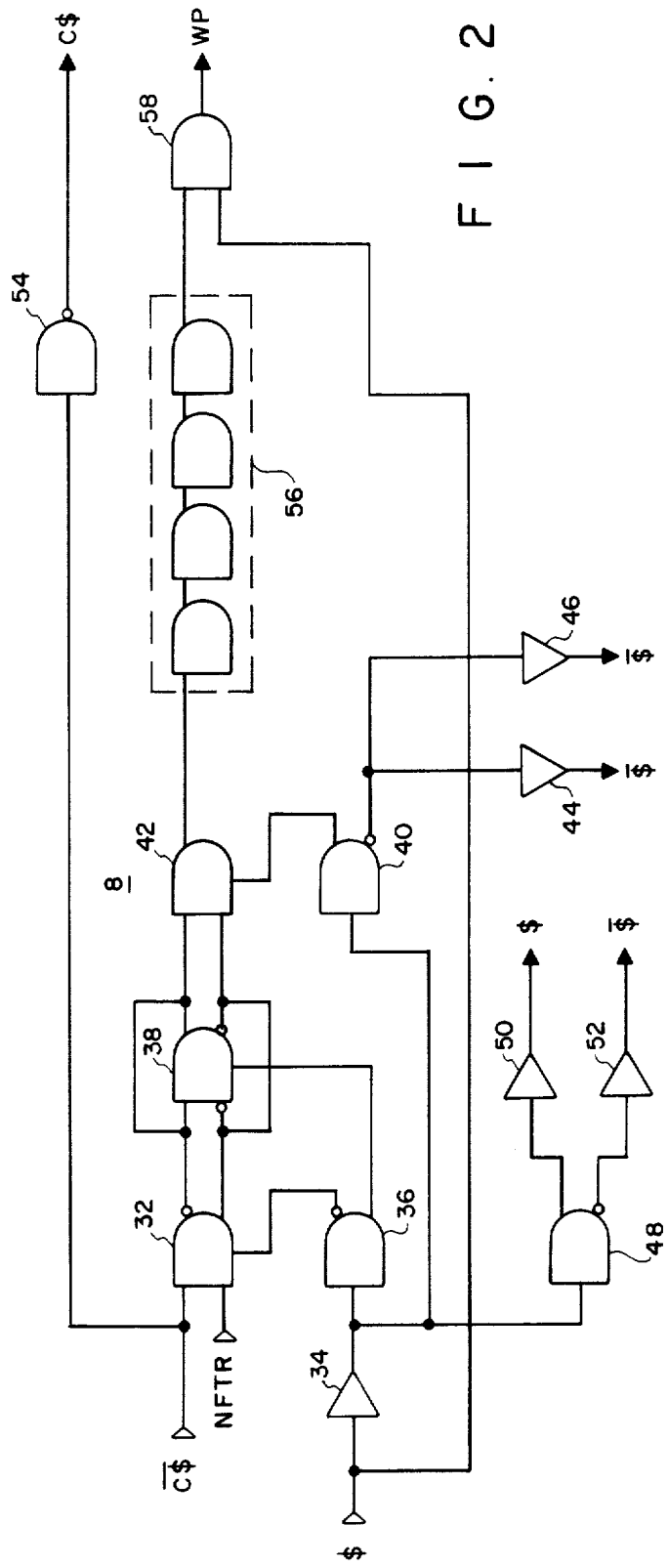
FIG. 2 is a logic diagram of a clock control circuit for use in the circuit shown in FIG. 1.

Referring now to the drawings in more detail, there is shown in FIG. 1 an improved data register constructed in accordance with the present invention. At the heart of the register circuit is a multiword RAM storage element 2 which, in an exemplary embodiment, comprises a 16×10 RAM array. That is, there are sixteen rows of ten bits each, or sixteen words of ten bits each. Ordinarily, a RAM may be addressed to a write mode or a read mode, but not both at substantially the same time. In accordance with the present invention, the RAM array 2 may be addressed to read and/or write both in the same clock cycle. Further, if the read address and the write address are directed to the same row in the RAM array, then the input data may be passed around the RAM array and directly to the output circuit. The circuit also has the capability of effecting non-functional tests (NFT) under a controlled condition.

To accomplish the foregoing, there is provided a one-of-three selector 4 which has applied thereto a first or NFT input signal and a second or data input signal. The output of the selector 4 is applied as input to a data-in latch 6. The latch 6 is gated by a write-pulse signal applied thereto from a timing control circuit 8, more about which will be said hereinafter. The output of the data-in latch 6 is applied through a write amplifier means 10 to the inputs of the RAM array 2. As will be more fully described hereinafter, the write amplifier 10 represents a plurality of such amplifiers, one for each bit of the data word. In the exemplary embodiment, each data word has ten bits, therefore the amplifier ten is representative of 10 such amplifiers. The output of the RAM array is applied to the input of a one-out-of-four selector 12. The output of the write amplifier 10 is also applied directly to the input of the selector 12. Additionally, the data terminal input to the selector 4 also applied as an input to the output selector 12.

The output selector 12, under the control of selected control signals, more about which will be said hereinafter, applies one-of-four signals to an output circuit latch 14. The output of the latch 14 is applied through an output amplifier 16 to the output terminal of the system. As with the input circuit, the output latch means 14 and the output amplifier 16 represent a plurality of such items corresponding in number to the number of bits of each word of the RAM array. Again, in the exemplary embodiment, each output amplifier and latch represent ten such units.

In effecting the selective addressing of the register module, there is provided a circuit identified as the NFT logic unit 18. The input to the circuit 18 is provided by the computer and comprises two control signals identified as NFTR representing a non-functional test reset and an NFTS signal representing a non-functional test shift signal. As will be described in more detail hereinafter, the output of the NFT logic circuit 18 includes four separately identifiable mode control signals. The first of these is labeled simply A. The second signal is labeled D, representing a data signal, the third signal is labeled S, representing a shift signal, while the fourth signal is labeled SR, representing a system reset. Two sets of address signals, a write address signal and an NFT address signal are applied as input signals to a one-out-of-two selector 20. The output of the selector 20 is applied as an input signal to a write address latch 22. The output of the write address latch 22 is applied to the input of a further one-out-of-two selector 24. A second input to the selector 24 comprises a read address signal. The output of the selector 24 is applied as an input signal to an address decode circuit 26. Each of the address signals applied as input to the selectors 20 and 24 are, in the exemplary embodiment four-bit address signals. The decode circuit 26, in the exemplary embodiment is a four-to-sixteen decoder which provides a one-out-of-sixteen address location signal derived from the four-bit input signals. Accordingly, the output of the decode circuit 26 comprises means for addressing a selected one of the sixteen word addresses in the exemplary RAM array 2.

The write address signal (WA) and the read address signal (RA) are applied as two input signals to an address compare circuit 28. The output of the comparison circuit 28 is applied as one input to the two input AND gate buffer 30. The other input to the buffer 30 is the A signal from the NFT logic circuit 18. The output of the buffer 30 comprises an "equal" signal and a "non-equal" signal indicative that the read address and the write address are or are not the same address in the RAM array. These output signals are connected respectively to control elements of the output selector 12.

Accordingly, if the output signal from the buffer 30 indicates that the write address and the read address are identical, then the selector 12 is controlled to pass the data signal from the data input terminal directly through the selector 12 to the output latch 14 and amplifier 16, bypassing the RAM array 2 so far as the output circuit is concerned. The data applied to the input terminal is, of course, also lodged in the appropriate address in the RAM array for later reference. If, on the other hand, the output signal from the buffer 30 indicates that the write address and the read address are different from each other, then the selector 12 is controlled to apply the read output data from the RAM array 2 through the selector 12 thence to the output latch 14 and buffer 16.

As was mentioned before, the signal input selector 4 is a one-out-of-three selector. The input signals as noted are the NFT signal, the data signal or an all zeroes signal. The selection between these three input signals is a function of the output signals from the NFT logic network 18. Thus the NFT signal is transmitted to the data latch 6 through the selector 4 when the NFT logic circuit output signal has a control signal issued on the line designaed S. The data input signal is transmitted through the selector 4 to the data latch 6 whenever the NFT logic circuit 18 has the appropriate control signal issuing on the output line designated D. When the output of the NFT logic circuit 18 has the control signal issuing on the line designated SR, then all zeroes are transferred through the selector 4 to the input of the data latch 6.

The zeroes are transmitted into the RAM array 2 and the associated circuitry and the input and output circuit thereof as a part of the initialization process for the circuit. This clears out any spurious data that may have occurred when the system is turned on. Zeroes are similarly inserted in the output circuit through the selector 12, again when the NFT logic circuit output signal is on the line SR. Again, as a part of the initialization of the module, under the control of the computer for the injection of NFT signals, certain test data identified as the non-functional test signals are transmitted through the input and output circuitry of the module when the NFT logic output circuit 18 produces a control signal on the line designated S. This feature will be further described hereinafter.

The timing control unit 8 has as an input signal, first, a clock or strobe signal. The second signal applied as input to the timing and control circuit 8 is the complement of a controlled strobe signal which is a signal sent from the processor indicative that a write into the RAM array is desired. A third input signal to the timing control circuit 8 is a complement of the NFTR signal. The output of the timing control circuit 8 includes a buffered controlled strobe, a buffered strobe signal and a buffered complement of the strobe signal in addition to the write pulse previously noted. As noted on FIG. 1, the complement of the strobe signal is connected to control the operation of the write address latch 22 as well as the operation of the selector 24. The controlled strobe output signal is applied to enable the address compare circuit 28. The buffered strobe signal is applied to control the operation of the output latch 14. More details of these relationships will appear hereinafter.

In FIG. 2 there is shown in logic diagram form the details of the timing control circuit 8. As was mentioned hereinbefore, the central processor unit provides a controlled strobe signal which is synchronized with the clock strobe signal but is issued only when a write command is required. The complement of the controlled strobe signal is applied as one input to a first AND gate 32. The second input to the AND gate 32 is the complement of the NFTR signal. The clock or strobe input signal is applied as an input to a non-inverting buffer amplifier 34 the output of which is applied as an input signal to a gate 36 having a differential output. The output of the gate 32 is applied as input signals to a latch 38. The true output of the gate 36 is applied to enable the latch 38. The complementary output of the gate 36 is applied to enable the gate 32.

The output of the buffer 34 is also applied as an input to a gate 40 which also has a differential output. The true output of the gate 40 is applied as an enabling signal for the gate 42. The input of the gate 42 is connected to the output of the latch 38. The complementary output of the gate 40 is connected to the input of a pair of buffers 44 and 46 to provide a pair of output strobe complement signals. Additionally, the output of the buffer 34 is applied as an input signal to a gate 48 which also has a differential output. A true output of the gate 48 is applied through a buffer 50 to provide a buffered strobe signal while the complementary output of the gate 48 is applied as input to a buffer 52 to provide a buffered strobe complement signal. The output of the buffer 52 is identical with the output of the buffers 44 and 46. They provide, however, separately buffered signals for application to the several components controlled thereby. The complement of the controlled strobe signal is also applied as input to an inverting buffer 54 to provide an output control strobe signal which as, hereinbefore noted, is applied as a control signal for the address comparison unit 28.

The output of the gate 42 is applied to the input of a series of cascaded gates constituting a delay line 56. The output of the delay line is applied as one input to an AND gate 58. A second input signal to the AND gate 58 is the input clock strobe signal. The output of the AND gate 58 comprises a write pulse signal which is applied to control the write amplifier 10 of FIG. 1. The write-pulse is, in fact, a delayed controlled strobe signal, indicative of a write sequence. The delay in the signal allows the write address to be firmly established at the output of the decoder 26 before the write-pulse is applied. This assures that the data to be written will be written into the proper address in the register array 2.

Figure 3:
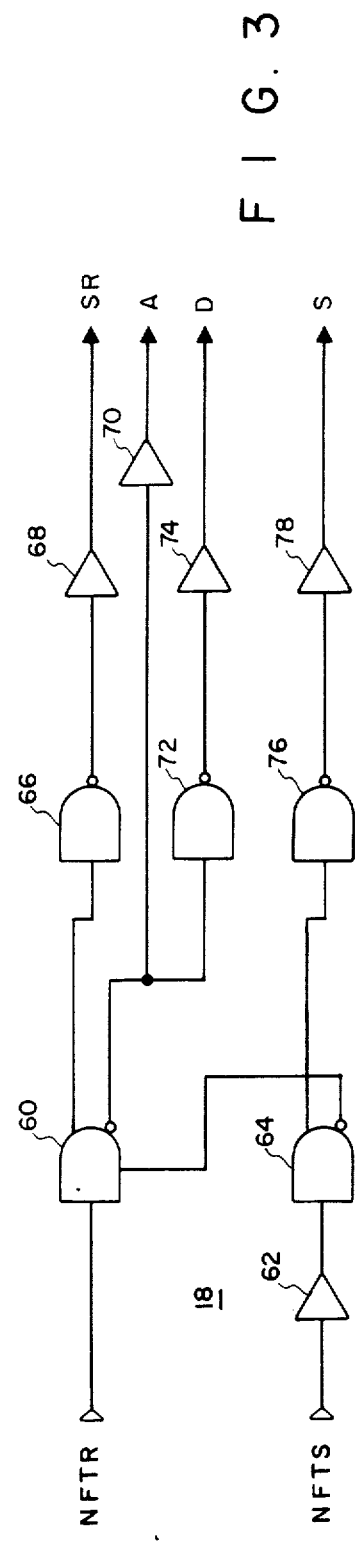
FIG. 3 is a logic diagram for a non-functional test logic circuit for use in accordance with the present invention.

In FIG. 3 there is shown, in logic diagram form, the circuit of the NFT logic unit 18 of FIG. 1. As was hereinbefore noted, the NFTR and the NFTS signals are control signals generated by the central processor as a part of the initialization routine of the system. The NFTR signal is applied as an input signal to the gate 60 which is provided with a differential output. Similarly, the NFTS signal is applied through a buffer 62 to the input of a gate 64 which is also provided with a differential output. The true output of the gate 60 is applied as input signal to an inverter 66 the output of which is applied through a buffer 68 to provide the reset signal, SR, hereinbefore referred to. The complementary output of the gate 60 is applied, first, through a buffer 70 to provide the A, or address, output to which reference was previously made. Secondly, the complementary output of the gate 60 is applied through an inverter 72 and then a buffer 74 to provide the previously referenced data output signal, S. The true output of the gate 64 is applied through an inverter 76 and a buffer 78 to provide the previously referenced shift output signal. The various combinations of the NFTR and the NFTS signal will provide the required or desired output signals as indicated.

In FIG. 4 there is illustrated an exemplary write amplifier, partly in logic diagram form and partly in schematic diagram form. As was mentioned in connection with FIG. 1, the write amplifier assembly shown in FIG. 4 is representative of one of a plurality of such circuits, there being provided on such circuit for each bit of the data word. Since, in the exemplary embodiment, there are ten bits to the data word, there are provided ten write amplifiers corresponding to the structure illustrated in FIG. 4. Each such amplifier includes a first input gate 80 having a differential output. The input to the gate 80 is the appropriate bit of the data signal. A second input 82 is also provided with a differential output. It will be remembered that the circuit shown in FIG. 4 represents one of ten. In the first of such circuits, the input to the gate 82 has the NFT data signal applied to one input terminal and a reference voltage applied to the other input terminal thereof. Subsequent ones of the write amplifier circuits have the NFT output thereof connected in cascade relationship to the input terminals of the gate 82 of the next such circuit. Thus, in the shift mode, the NFT signal may be shifted through the plurality of write amplifier circuits. A gate means 84 has input terminals connected, respectively, to the D, the S and the SR outputs of the NFT logic circuit 18. The output signals from the gate 84 are so arranged that in response to the D signal, the gate 80 will be enabled; in response to the S signal, the gate 82 will be enabled and in response to the SR signal the output of either of the gates will be so clamped as to load only zeroes into the output circuit of the write amplifier.

The output of the gate 80 is connected in parallel with the output of the gate 82 and both are applied as input signals into a gate 86. A gate 88 has as an input thereto the complement of the clock strobe signal from the timing control circuit 8 of FIGS. 1 & 2. The gate 88 also has a differential output with the true output thereof connected as an enabling signal for the gate 86. The output of the gate 86 is applied to the input of a latch 90. The complementary output from the gate 88 is applied as an enabling signal to the latch 90. Thus, the gates 80, 82 and 84 comprise the one out of three selector 4 shown in FIG. 1. Similarly, the gates 86, 88 and 90 comprise the data latch 6 illustrated in FIG. 1. The output from the latch 90 is applied as input signal to the write amplifier 10.

The write amplifier 10 comprises a first and second stage differential amplifier. The first stage differential amplifier includes a first transistor 92 and a second transistor 94 differentially connected with a constant current source 96 connected to the emitters in common. The base of the transistor 92 is connected to the true output of the latch 90 while the base of the transistor 94 is connected to the complementary output of the latch 90. The second differential amplifier of the write amplifier 10 includes a first transistor 98 and a second transistor 100 differentially connected and having their emitters connected in common to a transistor circuit 102. The transistor 102 forms part of a differential switch including a second transistor 104. The emitters of the transistors 102 and 104 are connected together and to a constant current source transistor 106. The output of the transistor 94 is connected to the base of the transistor 98 while the output of the transistor 92 is connected to the base of the transistor 100. The base of the transistor 104 is connected to receive a write pulse signal (WP) from the timing control circuit 8 of FIG. 1 and FIG. 2. The output of the transistor 98 is connected to the base of an emitter follower 108 while the output of the transistor 100 is connected to the base of an emitter follower 110.

The selector 4 effects a selection between the data signal applied to the input of the gate 80 an the NFT signal applied to the input of the gate 82 in accordance with whether the gate 80 or the gate 82 is enabled by the corresponding signals from the gate 84 depending upon whether the D or the S signal is active at the input thereof. If, on the other hand, the SR, or system reset, signal is active at the input of the gate 84, then the output of both of the gates 80 and 82 are pulled down such that all zeroes are transmitted to the output of the write amplifier. Otherwise, the respective outputs of the gates 80 or 82 is applied to the input of the latch assembly 6 and strobed by the complementary clock strobe signal applied at the input of the gate 88. In accordance with the present invention a write command to the memory unit is only applied during the negative half cycle of the clock signal. Accordingly, the gate 86 and the latch 90 are strobed by the complementary strobe signal from the timing and control circuit. The resulting output signal from the latch assembly 6 is applied as input signals to the cascaded differential amplifiers and the write amplifier 10. It will be recalled that the write pulse is a slightly delayed pulse triggered by the control strobe signal from the central processor unit. That write pulse signal is a negatively directed signal and is applied to enable or disable, as the case may be, the second differential amplifier of the write amplifier assembly 10. In other words, so long as the signal applied to the write pulse input terminal of the transistor 104 is at a logical high, the second differential amplifier comprised of the transistors 98 and 100 is disabled. When, on the other hand, a write pulse, a negative pulse, occurs, the transistor 104 is disabled and a transistor 102 is enabled thereby enabling the second differential amplifier to output signals corresponding to either the data or NFT signals, as the case may be. These are designated as a write data signal, WD from the emitter follower 110 and the complement of the write data signal, $\overline{WD}$ from the output of the emitter follower 108. These signals, as will be seen hereinafter, will be applied to control the operation of the memory array 2.

Before the signals output from the write amplifier can be applied to the memory, means must be provided for giving instructions as to which row of the memory unit should be the recipient of the write signals. Accordingly, means are provided for addressing the memory unit. In the present exemplary embodiment, a four-bit code is employed as the address signal. There is illustrated in FIG. 5 one of four identical address logic circuits.

As illustrated in FIG. 1, the first element of the address logic provides a selection between the NFT address and the write address. To this end, in FIG. 5, the NFT address is applied as an input signal to a first gate 112 which is provided with a differential output. Similarly, the write address is applied as an input signal to a gate 114 which is also provided with a differential output. The address, or A, signal from the NFT logic circuit 18 of FIG. 1 is applied as an input signal to a further gate 116 which is also provided with a differential output. The true output of the gate 116 is applied as an enabling signal for the gate 114 while the complementary signal from the gate 116 is applied as an enabling signal to the gate 112. The combination of the gates 112, 116 and 114 comprise a one-out-of-two selector 20 such as that shown in FIG. 1.

The output of the gate 112 is connected in parallel with the output of the gate 114 and connected as input to a gate 118. The output of the gate 118 is connected to the input of a latch 120. A gate 122 has the stobe complement signal as an input. Gate 122 also has a differential output, the true output of which is connected as an enabling signal for the gate 118 while the complementary output is connected as an enabling signal for the latch 120. The assembly of the gates 118, 120 and 122 comprise a latch circuit 22 such as that shown in FIG. 1.

The output of the latch 22 is applied as an input signal to a gate 124. The read address signal is applied as an input to a further gate 126. The gates 124 and 126 are each provided with a differential output, said differential outputs being connected together in parallel. The gate 128 has as one input signal the A or address signal from the NFT logic network and, as a second input, the strobe complement signal from the timing control network. The gate 128 has a differential output, the true output of which is connected as an enabling signal for the gate 126 while the complementary output is connected as a enabling signal for the gate 124. The arrangement of the gates 124, 126 and 128 comprise a second select mechanism 24 such as that shown in FIG. 1. The output of the selector 24 provides a true address signal AD and a complementary address signal $\overline{AD}$.

The arrangement shown in FIG. 5 provides first a selection between the NFT address signal and the write address signal. Then in the selector 24 and the result of that selection is compared with the read address signal and a selection made between the read address signal and the previously selected signal. Accordingly, the output address signal is the selected one of the NFT address, the write address, or the read address. As noted, the illustrated circuit accommodates one bit of the applied address signals. In the exemplary embodiment, the complete address is a four-bit signal. Therefore, the complete address logic system would include four circuits of the type shown in FIG. 5.

The output of the address logic circuits as shown in FIG. 5 is applied to the several inputs of the decode circuit shown in FIG. 6. In that circuit, a plurality of buffer amplifiers 130 are connected to selected ones of the output terminals of the several address logic circuits of FIG. 5. For example, the true output signal AD of the least significant bit of the address is connected separately to the inputs of the first two of the buffer amplifiers 130. The complementary outputs $\overline{AD}$ of the least significant bit is connected separately to the inputs of the next two of the buffer amplifiers. Similarly, the true output AD of the address logic circuit corresponding to the second least significant bit of the address is applied as an input signal to the third pair of buffer amplifiers 130 while the complementary address $\overline{AD}$ of the same logic circuit is applied to the fourth pair of buffer amplifiers. And so on for each additional bit of the address. In the exemplary embodiment, each of the buffers 130 is an emitter follower amplifier.

The outputs of selected ones of the buffer amplifiers are connected in pairs to provide an eight bit precoded output signal. The eight bit precoded output signals are applied as input to a matrix 132 establishing selected inputs to a plurality of gates 134. The matrix input to the gates 134 is such that any combination of the four bit address signals applied to the input of the buffers 130 will effect the selection of but one of the illustrated 16 gates to be active. The output of the gates 134 is applied, respectively, as an input to a corresponding one of a plurality of emitter follower buffer amplifiers 136. The outputs from the buffer amplifiers 136 are connected to corresponding ones of the control or word lines of the memory array 2. In the exemplary embodiment, since there are 16 rows of data in the memory array, there are 16 buffers 136 to individually control the activation of the selected row.

Figure 7:
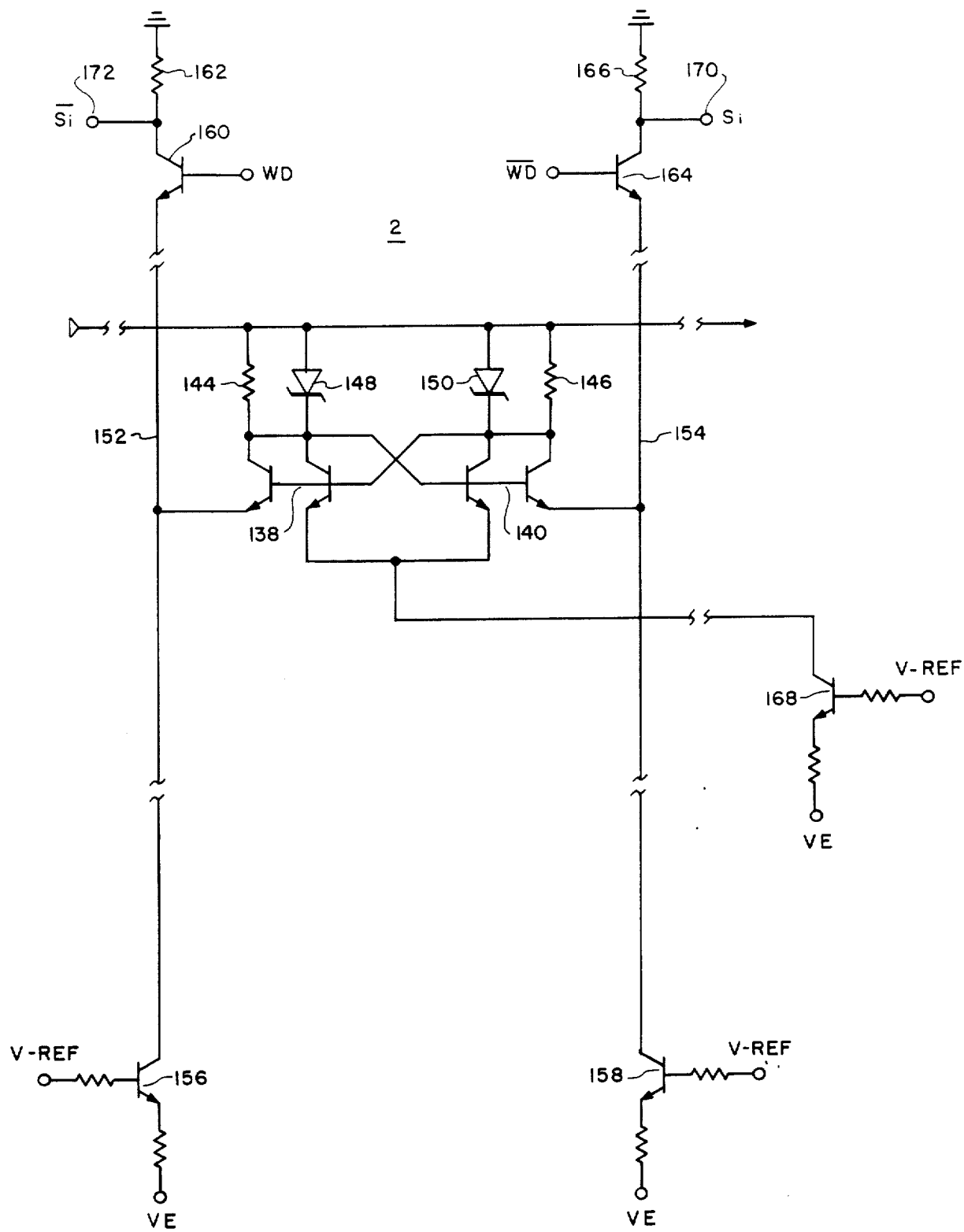
FIG. 7 is a schematic diagram of a portion of the RAM register array.

In FIG. 7 there is illustrated, in fragmentary form, the circuitry of the array 2. In FIG. 7, a single memory cell is shown which is representative of the plurality of cells making up the memory array 2. The signal memory cell is of a conventional CML configuration having cross-coupled transistor assemblies 138 and 140. The transistor assemblies 138 and 140 may each be dual transistors, as illustrated, or a single transistor having dual emitters. An enable, or control word, line 142 is connected through a resistor 144 to the collector arrangement of the transistors 138. A similar resistor 146 is connected between the control word line 142 and the collector arrangement of the transistors 140. Schotky diodes 148 and 150 are connected respectively in parallel with the resistors 144 and 146 to prevent overloading of the transistor assemblies 138 and 140. One emitter arrangement of the transistor 138 is connected directly to a bit line 152. The corresponding emitter of the transistor 140 is connected to a bit line 154.

The bit line 152 is connected at one end to a constant current source 156. Similarly, the bit line 154, at the same end, is also connected to a constant current source 158. At the other end, the bit line 152 is connected to the emitter of a control transistor 160 and collector electrode of which is connected through a resistor 162 to ground. The base of the transistor 160 is connected to the write data (WD) or true output of the write amplifier 10 shown in FIG. 4. In like manner, the other end of the bit line 154 is connected to the emitter of a control transistor 164, the collector of which is connected through a resistor 166 to ground. The base of the transistor 164 is connected to the complementary write data D)/ output of write amplifier 10. The second emitter of the transistor 138 is directly connected to the second emitter of the transistor 140 and together they are connected to a standby current source 168.

It will be appreciated that in the exemplary embodiment where an array 2 accommodates sixteen words of ten bits each, there will be sixteen cells of the type illustrated all connected identically to the bit lines 152 and 154. Similarly, there will be ten pairs of bit lines 152 and 154, each with their corresponding control transistors 160 and 164. Each such pair of bit lines will also have a corresponding sixteen memory cells, thus comprising ten columns of such memory cells. The memory cells of each horizontal row of the ten memory cells will be connected to the common word line 142 as in the illustrated example. Again, there will be sixteen such word lines, each having ten memory cells respectively enabled thereby.

At the junction of the collector of the transistor 164 and the resistor 166 is connected a signal terminal 170 which is the true output signal of the selected cell. Similarly, at the junction between the collector of the transistor 160 and the resistor 162 is a signal terminal 172 which is the complement of the signal terminal 170. The terminals 170 and 172 of each of the bit lines 152 and 154 are connected to corresponding input terminals of each of a plurality of output logic memories.

Figure 8:
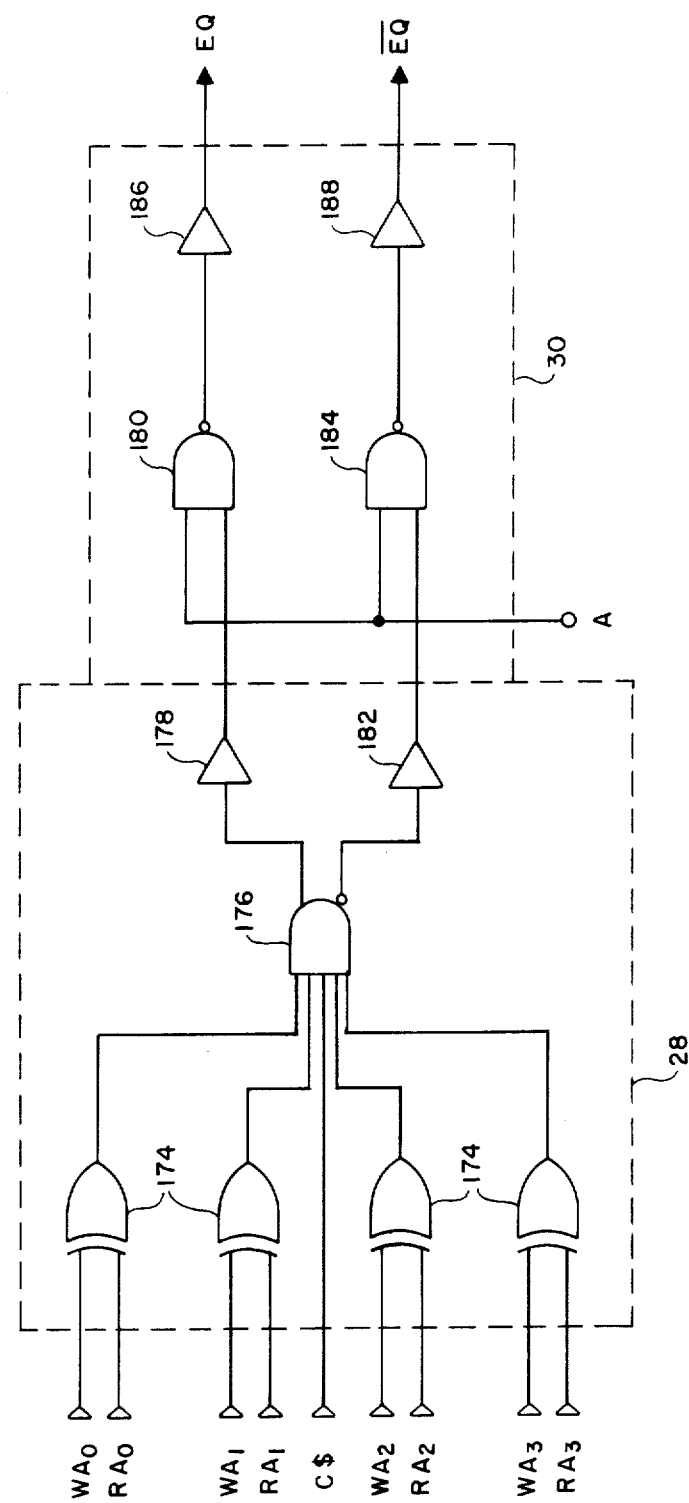
FIG. 8 is a logic diagram for a read/write address comparison circuit.

Before discussing the output logic networks however, reference is made to FIG. 8 wherein there is shown in logic diagram form the address compare assembly shown in FIG. 1. As was previously mentioned, the write address and the read address is compared for identity. Upon finding such an identity, the data input to the write amplifier is transmitted directly to the output logic network without first being processed into the memory array and then read from the memory array. Although the data presented for writing to the memory array will simultaneously therewith be written into such array. In the exemplary embodiment, the address information comprises a four-bit address. Accordingly, as shown in FIG. 8, there are four EXCLUSIVE OR comparators 174. In these comparators, the corresponding bits of the write address and the read address are compared. The output of the comparators are applied as input signals to an AND gate 176. The AND gate 176 has a true output which is connected through a buffer amplifier 178 to one input of an AND gate 180. The gate 176 also has a complementary output which is coupled through a buffer amplifier 182 to one input of an AND gate 184. A fifth input to the AND gate 176 is connected to receive the controlled strobe signal C$ from the timing and control circuit of FIG. 1 and FIG. 2. Thus, the comparison between the read and write address signals is only effected when the controlled strobe has indicated that a write procedure is to be effected.

It may be seen that the comparators 174, the gate 176 and the buffers 178 and 182 combine to provide the address compare assembly 28 illustrated in FIG. 1. A second input signal applied to the input terminals of the gates 180 and 184 is connected to the A signal from the NFT logic network 18 of FIGS. 1 and 3. If the NFT logic circuit, in response to control signals from the processor, indicates that an NFT routine is to be followed, both the gate 180 and 184 are disabled. The output of the gate 180 is coupled through a buffer amplifier 186 to provide an equal output signal, EQ. The output of the gate 184 is coupled through a buffer 188 to provide a complement of the equal signal, EQ. Again, it may be seen, that the assembly of the gates 180 and 184 and the buffers 186 and 188 comprise the gate 30 illustrated in FIG. 1. If all of the bits of the write address are identical to the corresponding bits of the read address, there will be issued from the buffer 186 a signal indicative of that equality and the complementary signal is output from the buffer 188. If the read and write address signals are not identical, then the relationship of the signals issued from the buffers 186 and 188 will be reversed.

The equal signal EQ and the equals complement signal $\overline{EQ}$ are two of the control signals applied to the input of the output logic network shown in FIG. 9. In order to accommodate the parallel output of all ten bits of an addressed word in the memory array, there are, in the exemplary embodiment, ten output logic circuits. The ten output logic circuits are shown in fragmentary form in FIG. 9 with one such circuit shown in full detail and two others in fragmentary form to illustrate an interconnection to be defined hereinafter. As shown in FIG. 9 the equal EQ and the complementary equal $\overline{EQ}$ signals, respectively, are applied to two input terminals of the gating means 190. The shift signal, S, from the NFT logic unit 18 is applied as a third input signal to the gating means 190. The fourth signal applied as input to the gating means 190 is the system reset or SR signal from the NFT logic unit 18. There are four output signals from the gating means 190. These comprise enabling signals for other units in the output logic network.

In addition to the gate 190, there are three input gates 192, 194 and 196. These three gates each have a true and a complementary output terminal with the output terminals of the three gates being connected in parallel. The gate 192 has a first input terminal connected to the Si signal terminal 170 illustrated in FIG. 7 while the other input terminal of the gate 192 is connected to the $\overline{Si}$ complementary signal terminal 172 also shown in FIG. 7. It will be recalled that the terminals 170 and 172 shown in FIG. 7 represent one pair of ten such pairs of terminals, one for each column of the memory array. The input terminals to the gate 192 are connected, accordingly, to the corresponding pair of terminals 170 and 172 of the column of bit position with which the individual output logic circuit is associated. One of the enabling output leads from gate 190 is connected to enable the gate 192.

The second gate 194 has its input connected to the corresponding bit position of the data input signal which is also applied to the gate 80 of the write amplifier logic circuit shown in FIG. 4. The gate 194 is enabled by a second of the enable output signals from the gate 190.

In connection with the discussion of the write logic circuit of FIG. 4, it was mentioned that the NFT signals applied to the input of the gate 82 in the first of the ten write logic circuits is cascaded from the output thereof to the input of the gate 82 of the second write logic circuit and so forth. The cascade connection to the subsequent one of the NFT gates 82 of FIG. 4 is taken from the terminals 170 and 172 of the array shown in FIG. 7. In the present example where there are ten bits of information in each word, the output of the tenth or most significant bit position write amplifier logic is connected from the terminals 170 and 172 to the input terminals of the first, or least significant bit position, gate 196 of the output logic circuits shown in FIG. 9. The gate 196 is connected to be enabled by a third of the output terminals from the gate 190.

As was mentioned, the output terminals of the gates 192, 194 and 196 are connected in parallel. The fourth output terminal of the gate 190 is connected to the complementary output of all of the three gates 192, 194 and 196. This arrangement of the gates 192, 194, 196 and the control gate 190 comprise the one-out-of-four selector arrangement 12 illustrated in diagramatic form in FIG. 1. The output of the selector 12 is applied as an input signal to a gate 198 the output of which is applied as input signal to a latch gate 200. A control gate 202 has one input terminal connected to the strobe signal output of the timing control circuit 8 of FIGS. 1 and 2 while the other input terminal thereof is connected to the complement of the strobe signal. The true output of the gate 202 is connected to enable the latch gate 200 while the complementary output of the gate 202 is connected to enable the gate 198. The gates 198 and 202 and the latch 200 comprise a first or master latch. The output of the latch 200 is applied as input signals to a gate 204 the output of which is applied to the input of a second latch gate 206. A further control gate 208 has as input signals the strobe signal S and the complementary strobe signal $ from the timing and control circuit 8.

The true output of the control gate 208 is connected to enable the gate 204 while the complementary output thereof is connected to enable the latch 206. The gates 204 and 208 and the latch 206 comprise a slave latch following the master latch previously described. The two latch assemblies as herein set forth comprise the latch arrangement 14 illustrated in FIG. 1. The true output of the latch 206 is connected to the input of a buffer amplifier 210 while the complementary output of the latch 206 is connected to the input of the buffer amplifier 212. In the exemplary embodiment of the present invention, the amplifiers 210 and 212 were, in fact, emitter follower amplifiers. The output of the amplifiers 210 and 212 are connected differentially to the input of an output buffer gate 214. The output of the gate 214 comprises the output signal corresponding to the correlated digit position of the data word.

The output terminals of the buffers 210 and 212 are connected to the input terminals, respectively, of the gate 196 of the next higher significant bit position of the output logic network. Thus, similarly to the input logic network, the output signal from the buffer amplifiers 210 and 212 are cascaded through the several output logic networks. At the last or most significant bit position of the output logic networks, the output terminals of the buffers 210 and 212 are applied as input signals to a gate 216 the true output of which is connected as an input signal to the further inverting gate 218. As will be seen hereinafter the output of the gate 218 is the NFT signal output when the system is placed in the shift mode as represented by the signal S output from the NFT logic network of FIGS. 1 and 3.

Looking at the operation of the output circuits as shown in FIG. 9, when the control gate 190 has the complementary equal signal $\overline{EQ}$ at a active high, the input gate 192 is enabled. The gates 194 and 196 are then disabled. The input signals to the gate 192 represent the addressed cell in the memory array. It will become, of course, apparent that when one of the gates 192 is enabled, the corresponding gate 192 is enabled in each of the other output logic circuits. The bit signals from the array are then transmitted into and latched by the latch assemblies 14 and transmitted to the corresponding output circuit through their associated output buffer gate 214 to the output terminals. In other words, when the read address is different from the write address for any given clock cycle, the data at the row designated by the read address will be read out from the array and transmitted to the output terminals Z.

When control gate 190 has the equal signal EQ to an active high, the second output terminal of the control gate 190 in each of the output logic circuits is active and enables the gate 194 in each of the output circuits. With the gate 194 enabled the gates 192 and 196 gate circuit are disabled. The input signal to the gate 194 in each of the output circuits is the same data bit applied to the corresponding ones of the input of the write amplifier circuits of FIG. 4. Thus, when the write address and the read address for any given clock cycle are the same, the input data is transmitted directly to the output circuit without requiring the output circuit to read it from the memory array. That signal is, of course, then transmitted through the latches 14 to the output amplifiers 16.

When the central processor has directed that the system be placed in shift mode, the output signal S from the NFT logic circuit 18 is active. That signal applied to the third input terminal of the gating control gate means 190 causes the gate 196 to be enabled, disabling the gates 192 and 194 in each of the output circuits. Similarly, the S signal indicating the shift mode is applied to one of the input terminals of the gate 84 of each of the write amplifier circuits of FIG. 4. That signal causes the gate 82 of the write amplifier to be enabled. With the gate 82 of the write amplifier enabled, the NFT signal is applied through the write amplifier and cascased sequentially through each of the subsequent write amplifiers then transmitted into the least significant bit position of the output logic circuits. Thereupon, the NFT signal is transmitted sequentially through each of the output logic circuits to the output terminals of the buffers 210 and 212 of the most significant bit position of the output logic circuits. That signal is then transmitted to the input of the gates 216 and 218 to comprise the NFT output signal as required by the processor. It may be noted that in the transition between adjacent write amplifiers and between adjacent output amplifiers, the NFT signal is inverted. This procedure provides the required testing of the several elements in accordance with the requirements of the processor.

When the processor has decreed a system reset, as in the case of a start-up condition, the NFT logic circuit outputs an active SR signal. That SR signal is applied as one of the input signals to the gate 84 of the write logic circuit shown in FIG. 4 the output of the gate array 4 is pulled low such that the output of the write amplifier places all zeroes in the addressed row. Similarly, the SR or reset signal applied to the input of the gate 190 in each of the output circuits conditions each of those output circuits such that a zero appears at each of the output terminals Z. By zeroing the entire array and all of the associated circuits in this manner, the entire register is cleared of any pre-existing or spurious signals which may have been existent in the system.

Thus there has been provided, in accordance with the present invention, an improved data register array which features RAM technology and provides a greater memory capacity in a smaller space than a conventional register array. Means are provided whereby the register may be read from and written into on the same clock cycle and when the read address and the write address are the same, the input data bypasses the memory array and is transmitted directly to the output thereof.

We claim:

1. In a digital computer system, a multiword data register comprising:
   a RAM array memory unit having a plurality of rows and a plurality of columns of cross-coupled transistor CML memory cells;
   data input terminal means;
   data input logic means connected between said data input terminal means and corresponding columns of said RAM array memory unit;
   a clock signal means providing a strobe signal having a cyclic configuration with a positive half cycle and a negative half cycle;
   a write-address input means connected to receive write-address signals;
   a read-address input means connected to receive read-address signals;
   an address selector switch means having said write-address signals applied to a first input thereof and having said read-address signals applied to a second input thereof, said address selector switch means being connected to be responsive to said strobe signal to provide selectively an output signal corresponding to said write-address signal during a first half cycle of said strobe signal and an output signal corresponding to said read-address signal during a second half of said strobe signal;
   a signal decoder means connected between said selector switch means and said RAM array to effect the addressing of a single row of said memory cells in accordance with the selected address;
   output circuit means including an output selector switch means, said output selector switch means having signals from an addressed row of said RAM array connected to a first input thereof and having said data input terminal means connected to a second input thereof; and
   an address comparator connected to said write-address input means and to said read-address input means, said comparator including means to produce comparator output signals indicative of the identity or difference of said write-address signals and said read-address signals;
   said output selector switch being connected to be responsive to said output signals from said comparator to select said data input signals when said compared address signals are identical and to select RAM array signals when said compared addresses are different.

2. A multiword data register as set forth in claim 1 wherein said RAM array includes a plurality of control word lines, one for each row of memory cells therein, said control word lines being connected to be selectively activated by output signals from said decoder means.

3. A multiword data register as set forth in claim 1 wherein said output circuit means includes output latch means connected between said output selector means and output terminal means.

4. A multiword data register as set forth in claim 1 characterized by the inclusion of NFT capability further including NFT logic circuit means responsive to computer generated NFT control signals to provide mode control signals for such register, and wherein:
   said data input logic means includes input signal selector means having said data input terminal means connected as one input thereof and having NFT signal input terminal means connected as a second input thereof, said input selector means being connected to be responsive to said mode control signals to effect a selection between said inputs to said selector;
   said address selector switch means includes further selecting means having an NFT-address signal means as an input thereof and being connected to be responsive to said mode control signals to effect a selection between said NFT-address signal and said write-address signal, and
   said output selector switch means having NFT signals connected to third input means thereof and being connected to be responsive to said mode control signals to effect a selection of said NFT signals.

* * * * *